United States Patent
Wu

(10) Patent No.: US 10,672,755 B2
(45) Date of Patent: Jun. 2, 2020

(54) CONDUCTIVE LAYER STRUCTURES FOR SUBSTRATES

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 0 days.

(21) Appl. No.: 16/379,811

(22) Filed: Apr. 10, 2019

(65) Prior Publication Data
US 2019/0237455 A1   Aug. 1, 2019

Related U.S. Application Data

(63) Continuation of application No. 15/595,434, filed on May 15, 2017, now abandoned.
(Continued)

(51) Int. Cl.
| | | |
|---|---|---|
| H01L 51/52 | (2006.01) |
| H01L 27/16 | (2006.01) |
| H01L 29/786 | (2006.01) |
| H01L 27/01 | (2006.01) |
| H01L 51/00 | (2006.01) |
| H01L 27/02 | (2006.01) |
| H01L 27/12 | (2006.01) |
| H01L 29/06 | (2006.01) |
| H01L 29/417 | (2006.01) |
| G02F 1/133 | (2006.01) |
| G02F 1/1333 | (2006.01) |
| G02F 1/1343 | (2006.01) |
| G02F 1/1347 | (2006.01) |
| G02F 1/153 | (2006.01) |
| H01L 27/32 | (2006.01) |

(52) U.S. Cl.
CPC .......... *H01L 27/016* (2013.01); *G02F 1/1343* (2013.01); *G02F 1/1347* (2013.01); *G02F 1/13306* (2013.01); *G02F 1/133305* (2013.01); *G02F 1/133308* (2013.01); *G02F 1/1533* (2013.01); *H01L 27/0218* (2013.01); *H01L 27/1251* (2013.01); *H01L 27/32* (2013.01); *H01L 29/0653* (2013.01); *H01L 29/41733* (2013.01); *H01L 29/786* (2013.01); *H01L 51/0097* (2013.01); *H01L 51/5256* (2013.01); *H01L 27/3244* (2013.01); *H01L 2251/5338* (2013.01); *Y10T 428/10* (2015.01)

(58) Field of Classification Search
CPC ........ H01L 27/016; H01L 27/32; H01L 51/52
See application file for complete search history.

(56) References Cited

U.S. PATENT DOCUMENTS

| 9,276,055 B1 | 3/2016 | Son |
| 2005/0078459 A1 | 4/2005 | Yeon |

(Continued)

*Primary Examiner* — Fazli Erdem
(74) *Attorney, Agent, or Firm* — Winston Hsu

(57) ABSTRACT

An example substrate includes a surface, a plurality of thin film layers disposed on the surface, and a conductive layer disposed on the surface. The conductive layer includes a bending structure. The bending structure includes a wavy edge and includes a plurality of openings, where a shape of at least one opening of the plurality of openings has a contour having a first curved portion, and a curvature of a portion of the wavy edge is different from a curvature of the first curved portion.

18 Claims, 13 Drawing Sheets

Related U.S. Application Data

(60) Provisional application No. 62/450,106, filed on Jan. 25, 2017.

(56) References Cited

U.S. PATENT DOCUMENTS

| | | |
|---|---|---|
| 2007/0153145 A1 | 7/2007 | Kim |
| 2008/0111137 A1 | 5/2008 | Yan |
| 2013/0249740 A1 | 9/2013 | Shedletsky |
| 2014/0097408 A1 | 4/2014 | Kim |
| 2015/0036299 A1 | 2/2015 | Namkung |
| 2015/0355516 A1 | 12/2015 | Imai |
| 2016/0035759 A1 | 2/2016 | Kwon |
| 2016/0105950 A1* | 4/2016 | Drzaic .................. B05D 3/002 174/251 |
| 2016/0117002 A1 | 4/2016 | Lee |
| 2016/0172427 A1* | 6/2016 | Lee .................... H01L 27/3276 257/40 |
| 2016/0179268 A1 | 6/2016 | Hong |
| 2016/0218305 A1* | 7/2016 | Kim .................. G02F 1/133305 |
| 2016/0240602 A1 | 8/2016 | Ki |
| 2016/0357293 A1 | 12/2016 | Chen |
| 2016/0374191 A1 | 12/2016 | Kim |
| 2017/0062532 A1 | 3/2017 | Jeong |
| 2017/0110479 A1 | 4/2017 | Chen |
| 2017/0117303 A1 | 4/2017 | Lee |
| 2017/0188463 A1 | 6/2017 | Kim |
| 2017/0237025 A1 | 8/2017 | Choi |
| 2017/0256599 A1* | 9/2017 | Kim ..................... G09G 3/3291 |
| 2017/0262109 A1 | 9/2017 | Choi |
| 2017/0271617 A1 | 9/2017 | Choi |
| 2017/0277288 A1 | 9/2017 | Choi |
| 2017/0278918 A1 | 9/2017 | Jeon |
| 2017/0294495 A1* | 10/2017 | Shyu ....................... G06F 3/041 |
| 2017/0352717 A1* | 12/2017 | Choi ................... H01L 51/0097 |
| 2018/0088713 A1 | 3/2018 | Yang |
| 2018/0092166 A1 | 3/2018 | Kim |

\* cited by examiner

US 10,672,755 B2

CONDUCTIVE LAYER STRUCTURES FOR SUBSTRATES

CROSS REFERENCE TO RELATED APPLICATIONS

This patent application is a continuation application and claims priority of U.S. patent application Ser. No. 15/595,434, filed on May 15, 2017, which claims the benefit of U.S. Provisional Patent Application Ser. No. 62/450,106, filed Jan. 25, 2017, and the entire contents of which are incorporated herein by reference.

BACKGROUND OF THE INVENTION

1. Field of the Invention

Examples of the present disclosure relate to conductive layer structures for substrates.

2. Description of the Prior Art

Electronic devices, such as portable computers, typically include rigid displays made of rigid display structures. For example, a liquid crystal display (LCD) can be formed from a stack of rigid display structures. It may be challenging to include a rigid display into the housing of some devices, such as mobile devices (e.g., mobile telephones, watches, etc.). It is desirable to include flexible displays in such devices. A flexible display typically includes organic layers (e.g., organic light emitting layer, organic passivation layer, etc.), a thin semiconductor layer, and conductive layers all formed on a flexible substrate (e.g., a polymer substrate). A conductive layer includes metal conductive lines electrically coupled to circuitry in the thin semiconductor layer. Such a flexible display can be curved, folded, stretched, or the like (generally referred to as "flexed"). However, in some cases, the metal conductive lines in a conductive layer can be damaged when the displayed is flexed. For example, when the display is flexed, the metal conductive lines can be cracked, causing a disconnection therein.

SUMMARY OF THE INVENTION

Conductive layer structures for substrates are described. In an embodiment, a display device includes a substrate including a surface, a thin film transistor layer disposed on the surface, and a light emitting unit disposed on the surface and electrically connected to the thin film transistor layer. The display device further includes a conductive layer disposed on the surface. The conductive layer includes a bending structure. The bending structure includes a wavy edge and includes a plurality of openings, where a shape of at least one opening of the plurality of openings has a contour having a first curved portion, and a curvature of a portion of the wavy edge is different from a curvature of the first curved portion.

In another embodiment, a substrate includes a surface, a plurality of thin film layers disposed on the surface, and a conductive layer disposed on the surface. The conductive layer includes a bending structure. The bending structure includes a wavy edge and includes a plurality of openings, where a shape of at least one opening of the plurality of openings has a contour having a first curved portion, and a curvature of a portion of the wavy edge is different from a curvature of the first curved portion.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
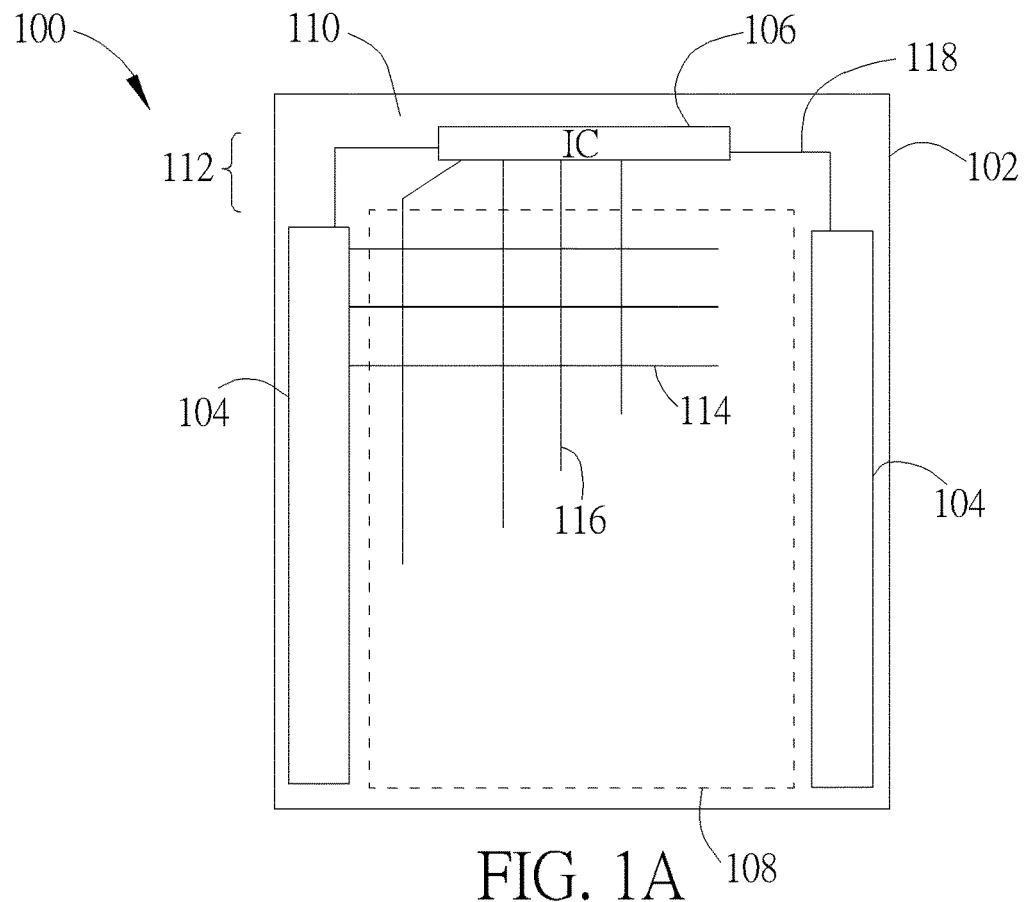
FIG. 1A is a schematic top view of a display device according to an embodiment.

FIG. 1A is a schematic top view of a display device 100 according to an embodiment. The display device 100 includes a substrate 102 having a gate driver region 104, an active area region 108, and an inactive area region 110. An integrated circuit (IC) 106 is disposed in the inactive area region 110. The active area region 108 includes a pixel array (FIG. 2), which is described further below. The gate driver region 104 includes circuitry (e.g., gate drivers) configured to drive gates of thin-film transistors (TFTs) formed in the active area region 108. The gate drivers select rows of pixels in the pixel array for updating. The IC 106 includes circuitry (e.g., source drivers) configured to drive sources of the TFTs formed in the active area region 108. The source drivers supply display data to selected pixel rows.

Conductive lines 114, 116, and 118 are formed on the substrate 102. The conductive lines 114, 116, and 118 are formed of metal, an oxide semiconductor, or a metal oxide. In embodiments, metal can be Ti, Pt, Au, Ni, Al, Mo, Cu, and the like, as well as alloys of such elements. In embodiments, an oxide semiconductor can be a material having at least one kind of element selected from among In, Ga, Zn, and Sn. In embodiments, the metal oxide can be ITO (indium tin oxide)

or IZO (indium zinc oxide). The conductive lines 114, 116, and 118 can be on a plurality of conductive layers disposed on the substrate 102. The conductive lines 114 are coupled between gate drivers in the gate driver region 104 and TFTs in the active area region 108. The conductive lines 114 are also referred to herein as "gate lines 114." The conductive lines 116 are coupled between source drivers in the IC 106 and TFTs in the active area region 108. The conductive lines 116 are also referred to herein as "source lines 116." The conductive lines 118 are coupled between control circuitry in the IC 106 and the gate drivers in gate driver region 104. For purposes of clarity by example, FIG. 1A shows only the conductive lines 114, 116, and 118 having the functions described above. The substrate 102 can include other conductive lines formed thereon, including conductive lines to supply anode or cathode voltage to light-emitting diode (LED) elements in the pixel array, as well as conductive lines coupled to touch sensing electrodes integrated with the display device 100 (if present).

The substrate 102 can be flexible and can be a polymer layer, such as a thin plastic film formed from polyimide, polyethylene naphthalate (PEN), polyethylene terephthalate (PET), or other suitable polymers or combination of such polymers. The substrate 102 can include other suitable materials, such as a metal foil covered with a dielectric, a multi-layer polymer stack, a thin glass film bonded to a thin polymer, a polymer composite film comprising a polymer material combined with nanoparticles or microparticles dispersed therein, and the like. In some embodiments, the substrate 102 can be a rigid substrate, such as glass. The IC 106 comprises an application specific integrated circuit (ASIC) or the like that is mechanically mounted to the substrate 102 and electrically coupled to the conductive lines 116 and 118. The IC 106 can include other contacts or pins that are coupled to a flexible printed circuit board (PCB) or the like (not shown).

A fan-out region 112 is a portion of the inactive region 110. The conductive lines 116 and 118 are coupled to pins of the IC 106 in the fan-out region 112. In an embodiment, conductive lines disposed on the substrate 102 include bending structures that improve stability and reliability thereof when the substrate 102 is flexed (e.g., bent, curved, folded, stretched, etc.). Various embodiments of the bending structure are described below.

In the embodiment shown, the display device 100 is a gate-in-panel (GIP) device, where the gate drivers are formed using thin-films on the substrate 102 in the gate driver region 104. In other embodiments, the gate drivers can be integrated on the IC 106, rather than formed directly on the substrate 102. In such case, the gate driving region 104 is omitted and replaced with a wiring region having conductive lines that electrically couple gate drivers in the IC 106 with the gate lines 114. Also, in the embodiment shown in FIG. 1A, the gate driver region 104 is disposed on both sides of the active area region 108. In another embodiment, the gate driver region 104 is disposed on a single side of the active area region 108.

Figure 1B:
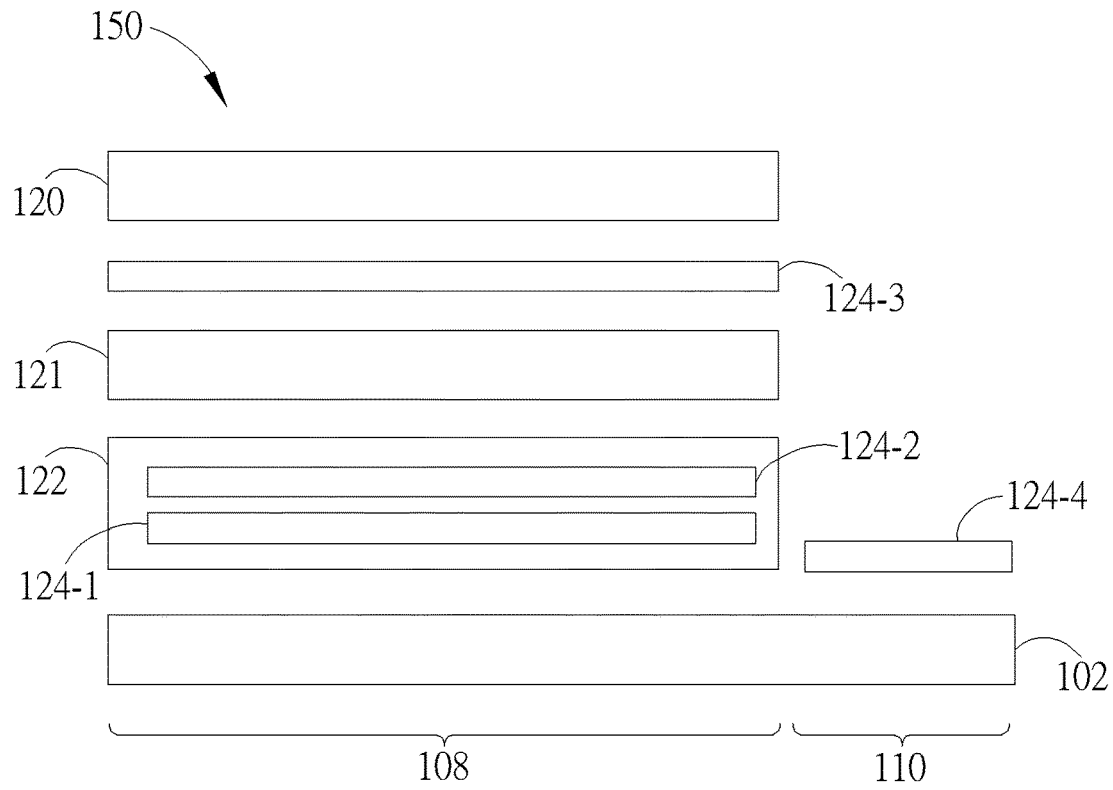
FIG. 1B is an exploded side view showing a portion of a display device according to an embodiment.

FIG. 1B is an exploded side view 150 showing a portion of the display device 100 according to an embodiment. The display device 100 generally includes multiple layers, including a cover layer 120, a light emitting layer 121, a TFT layer 122, conductive layers 124, and a substrate layer (e.g., the substrate 102). The display device 100 can include other layers, such as a carrier layer (not shown) that supports the substrate 102 and the layers disposed thereon. Further, some or all of the layers 120, 121, 122, and 124 can be further divided into a plurality of sublayers.

The TFT layer 122 is disposed on the surface of the substrate 102 in the active area region 108. The light emitting layer 121 is disposed on the surface of the substrate 102 in the active area region 108 and is electrically connected to the TFT layer 122. In general, the conductive layers 124 are disposed on the surface of the substrate 102. Some of the conductive layers 124 are sublayers of the TFT layer 122. For example, the TFT layer 122 can include a conductive layer 124-1 that is patterned into at least the gate lines 114, and a conductive layer 124-2 that is patterned into at least the source lines 116. The TFT layer 122 can include more than two conductive layers (not shown).

One or more other conductive layers 124 are disposed on the surface of the substrate 102 in the inactive area region 110. For example, a conductive layer 124-4 can be patterned into conductive lines, pads, etc. in the inactive area region 110 (e.g., the fan-out region 112 and the gate driver region 104). A given conductive layer 124 includes one or more bending structures formed therein. As described further herein, each bending structure includes a plurality of openings, where a shape of at least one opening thereof has at least one curved portion. Various embodiments of the bending structure are described below.

In some embodiments, the conductive layers 124 include a touch electrode layer 124-3. The touch electrode layer 124-3 is disposed on the surface of the substrate 102. The touch electrode layer 124-3 includes one or more conductive layers patterned to include electrodes and conductive lines for the purpose of touch or proximity sensing of input object(s). As shown, the touch electrode layer 124-3 can be formed on an inner surface of the cover layer 120 or on an additional substrate attached to the cover layer 120. Alternatively, at least a portion of the touch electrode layer 124-3 can be formed in the TFT layer 122 or between the TFT layer 122 and the light emitting layer 121. The touch electrodes and/or conductive lines coupled thereto in the touch electrode layer 124-3 can include bending structures, as described further herein.

Figure 2:
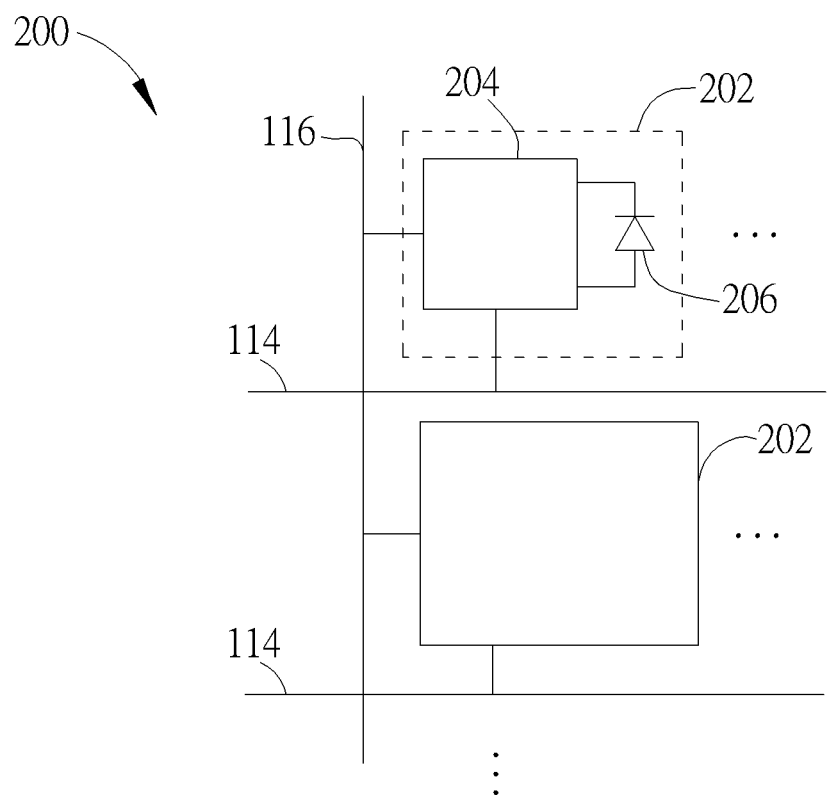
FIG. 2 is a circuit diagram showing a portion of a pixel array of a display device according to an embodiment.

FIG. 2 is a circuit diagram showing a portion of a pixel array 200 of the display device 100 according to an embodiment. The pixel array 200 is formed in the active area region 108 of the display device 100. The pixel array 200 includes pixels 202 arranged into rows and columns. The pixels 202 are controlled using a pattern of gate lines 114 and source lines 116. Each pixel 202 includes an LED element 206, such as an organic LED (OLED) or micro LED or the like, as well as an associated control circuit 204. The control circuit 204 can include TFT (s) and capacitor (s). The control circuit 204 is coupled to a source line 116 and a gate line 114 to control the LED element 206. The control circuit 204 is formed in the TFT layer 122. The LED element 206 is formed in the light-emitting layer 121. The gate lines 114 and the source lines 116 are formed in the TFT layer 122, as described above.

Figure 3A:
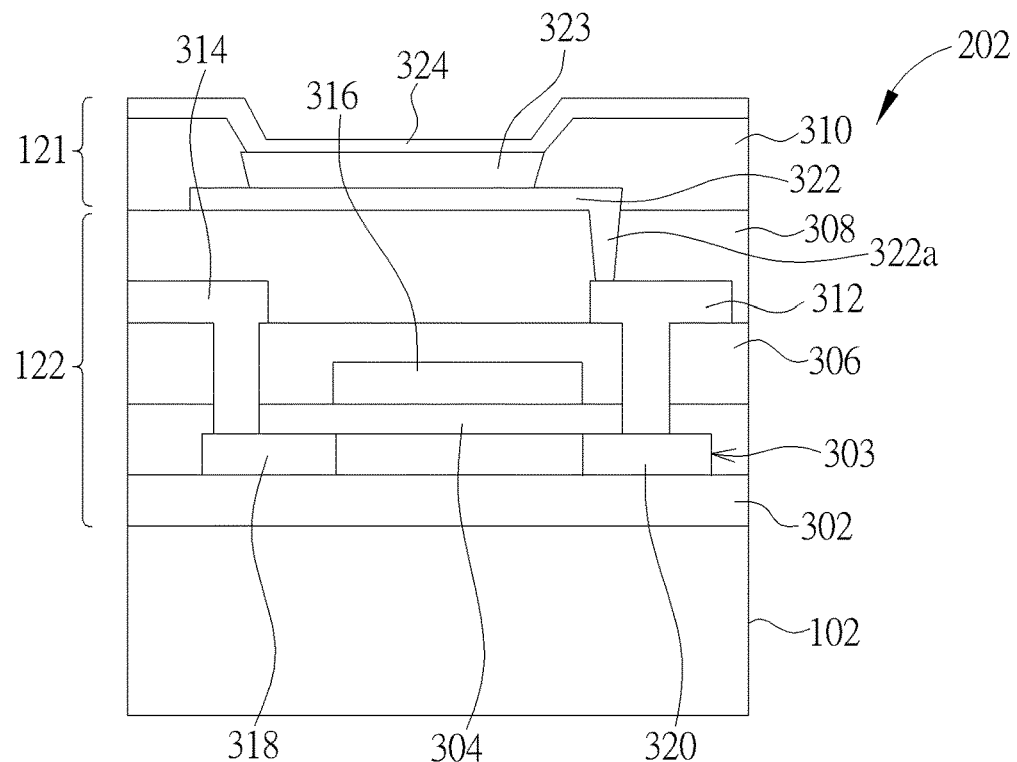
FIG. 3A is a cross-sectional view showing a portion of a pixel of a display device according to an embodiment.

FIG. 3A is a cross-sectional view showing a portion of a pixel 202 of the display device 100 according to an embodiment. The pixel 202 includes multiple layers formed on the substrate 102. In the embodiment, the layers include a buffer layer 302, a semiconductor layer 303, a dielectric layer 304, a conductive layer having a gate electrode 316, a dielectric layer 306, a conductive layer having a drain contact 312 and a source contact 314, a dielectric layer 308, a conductive layer having a first electrode 322, an organic layer 323, a pixel define layer 310, and a conductive layer having a second electrode 324. The second electrode 324, the organic layer 323, the pixel define layer 310, and the first electrode 322 are part of the light-emitting layer 121. The dielectric layer 308, the source contact 314, the drain contact 312, the gate electrode 316, the dielectric layer 306, the dielectric layer 304, the semiconductor layer 303, and the buffer layer 302 are part of the TFT layer 122. The first electrode 322 can be an anode and the second electrode 324 can be a cathode, and vice versa. The first electrode 322 can be electrically connected to the drain contact 312 through the via hole 322a in the dielectric layer 308.

In the embodiment of FIG. 3A, the second electrode 324, the organic layer 323, the pixel define layer 310, and the first electrode 322 form an OLED (e.g., LED element 206, FIG. 2). While FIG. 3A shows an OLED structure, LED element 206 can be implemented using other structures. For example, LED element 206 can be a micro LED element, and will be described in FIG. 3B below. The organic layer 323 includes one or more layers of organic emissive material. The anode electrode 322 can be metal or a transparent conductive material. The cathode electrode 324 can be metal or a transparent conductive material. Suitable metal can be Mg, Ca, Al, Ag, W, Cu, Ni, Cr, or an alloy thereof. Suitable transparent conductive material can be ITO (indium tin oxide), IZO (indium zinc oxide), zinc oxide, or indium oxide.

The semiconductor layer 303 is formed of a semiconductor material, such as silicon or an organic semiconductor material. For example, the semiconductor layer 303 can be amorphous silicon, polysilicon, or metal oxide such as IGZO. The semiconductor layer 303 can include a source region 318 and a drain region 320 formed therein through diffusion. The source contact 314 is electrically coupled to the source region 318 through a via in the dielectric layer 306 and the dielectric layer 304. The drain contact 312 is electrically coupled to the drain region 320 through another via in the dielectric layer 306 and the dielectric layer 304. The gate electrode 316 is separated from a channel between the source region 318 and the drain region 320 by the dielectric layer 304 (e.g., a gate dielectric). The gate electrode 316 can be formed of metal or an oxide semiconductor. The source contact 314 and the drain contact 312 can be formed of metal. The gate electrode 316, the dielectric layer 304, the source region 318, and the drain region 320 implement a TFT used in the control circuit 204 (FIG. 2) that drives the LED element 206. While an example TFT structure is shown in FIG. 2A, other TFT structures can be used. For example, the source region 318 and the drain region 320 can be formed of metal, rather than diffusion regions in the semiconductor layer 303. The source contact 314, the gate electrode 316, and the drain contact 312 are coupled to conductive lines having bending structures, as described further herein.

Figure 3B:
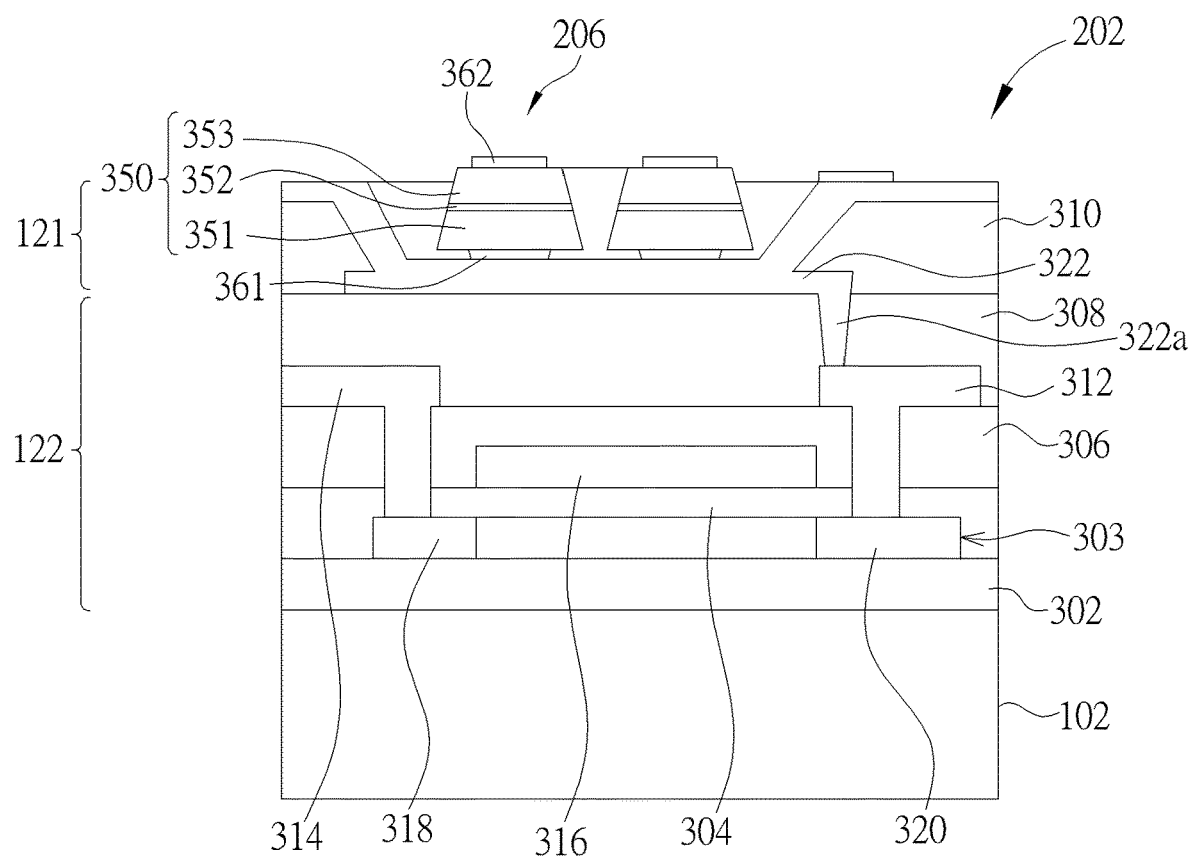
FIG. 3B is a cross-sectional view showing a portion of a pixel of a display device according to another embodiment.

FIG. 3B is a cross-sectional view showing a portion of a pixel 202 of the display device 100 according to an embodiment. In the present embodiment, the LED element 206 is a micro LED element. Elements of FIG. 3B that are the same or similar to those of FIG. 3A are designated with identical reference numerals and are described in detail above. At least one micro LED element 206 can be disposed in one pixel. The micro LED element can include a p-n diode 350, a first contact electrode 361 located at one side of the p-n diode 350, and a second contact electrode 362 located at another side of the p-n diode 350. The p-n diode 350 can include a first semiconductor layer 351, a second semiconductor layer 353, and multi quantum well (MQW) structure 352 disposed between the first semiconductor layer 351 and the second semiconductor layer 353. The first semiconductor layer 351 can be a p-type semiconductor layer and the second semiconductor layer 353 can be an n-type semiconductor layer, and vice versa.

Figure 4A:
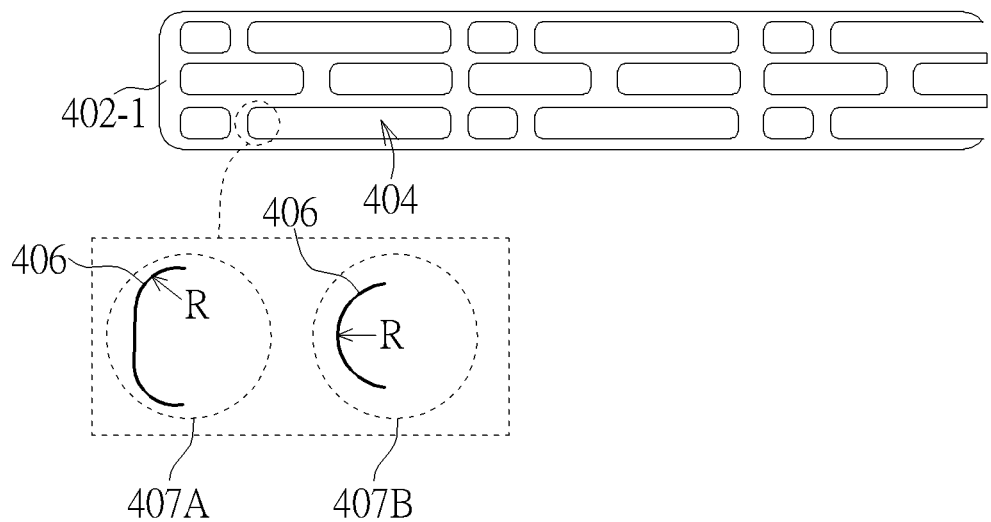
FIGS. 4A-4D are top views showing bending structures for conductive lines according to embodiments.

FIGS. 4A-4D are top views showing bending structures for conductive lines according to embodiments. FIG. 4A is a top view showing a bending structure 402-1 according to an embodiment. The bending structure 402-1 comprises a conductive line having a plurality of openings 404 therein. The bending structure 402-1 includes a width along the Y-direction and a length along the X-direction. Each opening 404 is generally rectangular, but having rounded corners. Thus, each opening 404 includes a curved portion 406. In an embodiment, as shown in detail 407A, the curved portion 406 includes a radius R and is disposed in each corner of the opening 404. In another embodiment, as shown in detail 407B, the curved portion 406 includes a radius R and is disposed on each side of the opening 404. In general, each opening 404 includes a curved portion having a single radius of curvature. The openings 404 can have other shapes, including polygons other than rectangles or a circle.

The bending structure 402-1 can include any number of the openings 404 in various arrangements. In the example of FIG. 4A, the bending structure 402-1 includes three rows of openings 404 that extend along the length, but the bending structure 402-1 can include more or less than three rows of openings 404. The length of each opening 404 along a given row can varying from one opening to the next according to a pattern, which may be repeated along the length. The patterns of openings between the rows can be staggered from one row to the next.

In the present disclosure, the bending structure can be formed by bending the conductive layer. According to some embodiments, the bending process can be conducted before the display device is presented to the consumers (or users). Alternatively, according to some embodiments, when a flexible substrate is used, the bending process can be conducted by the consumer. That is, originally, the substrate and the conductive layer can be flat, and then the consumer can bend the substrate and the conductive layer to have the bending structure according to requirement. In the disclosure, the bending structure can mean a structure that has been bent, or a structure that will be bent by the consumers.

Figure 4B:
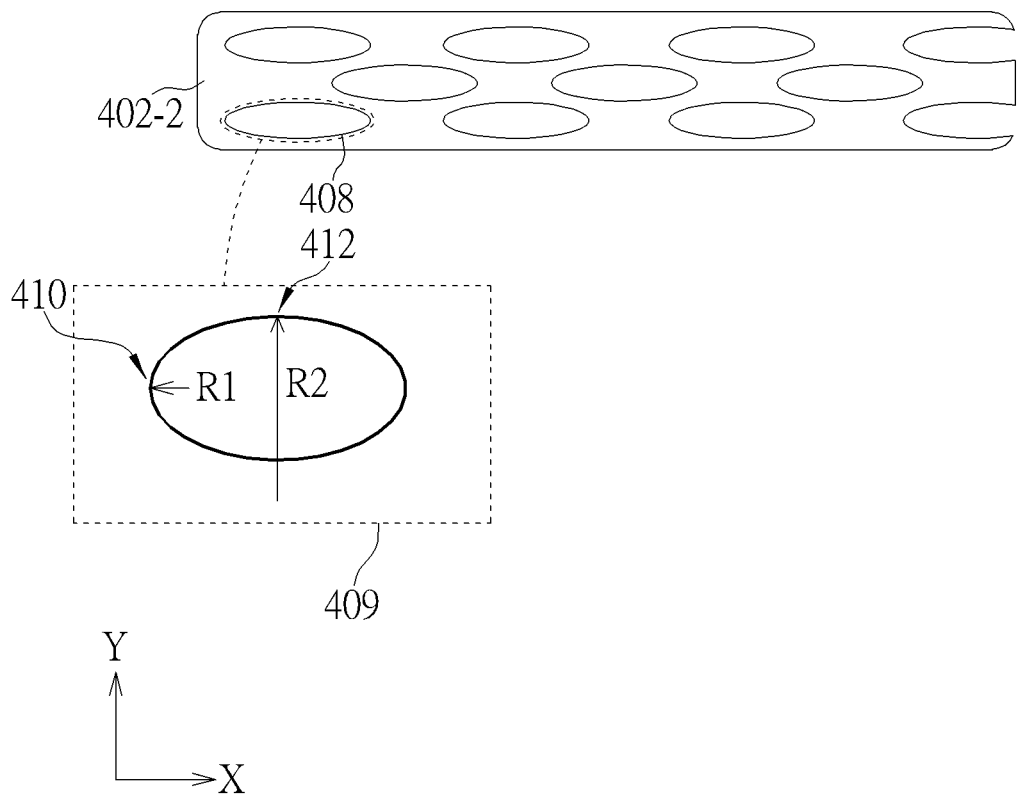

FIG. 4B is a top view showing a bending structure 402-2 according to an embodiment. The bending structure 402-2 comprises a conductive line having a plurality of openings 408 therein. The bending structure 402-2 includes a width along the Y-direction and a length along the X-direction. As shown in detail 409, each opening 408 is elliptical in shape having a first curved portion 410 and a second curved portion 412. The first curved portion 410 includes a curvature radius R1, and the second curved portion 412 includes a radius R2. The bending structure 402-2 can include any number of the openings 408 in various arrangements. In the example of FIG. 4B, the bending structure 402-2 includes three rows of openings 408, but the bending structure 402-2 can include more or less than three rows of openings 408. In the present example of FIG. 4B, each opening 408 is the same or similar in size, but in other examples the openings 408 can have different sizes from one opening to another. Further, while a staggered pattern of openings 408 is shown, the bending structure 402-2 can have other patterns of the openings 408.

Figure 4C:
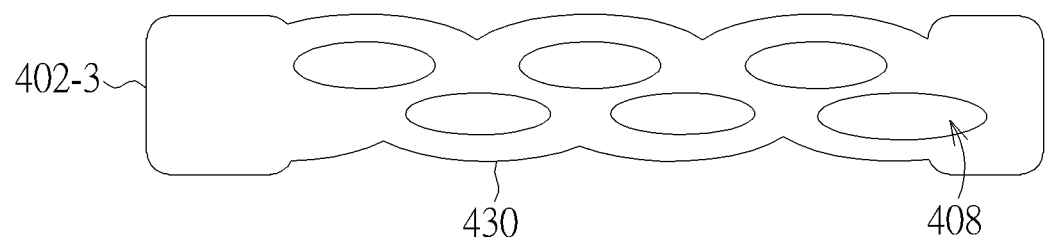

FIG. 4C is a top view showing a bending structure 402-3 according to an embodiment. The bending structure 402-3 comprises a conductive line having a plurality of openings 408 similar to those of the bending structure 402-2 shown in FIG. 4B. The bending structure 402-3 includes a width along the Y-direction and a length along the X-direction. The bending structure 402-3 differs from the bending structure 402-2 by having undulating edges 430 (e.g., serpentine edges) along at least a portion of the length thereof. While the openings 408 are shown in the example, the bending structure 402-3 can have openings 404 as shown in FIG. 4A (i.e., the bending structure 402-1 can be configured with undulating edges 430).

Figure 4D:
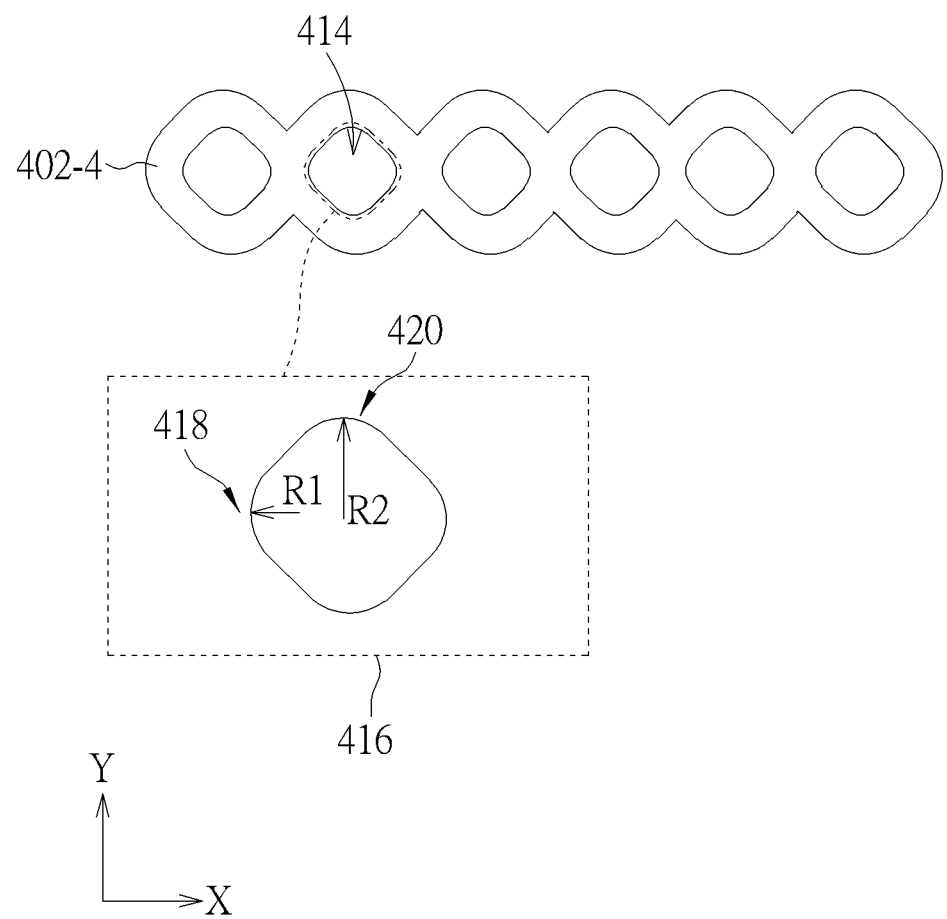

FIG. 4D is a top view showing a bending structure 402-4 according to an embodiment. The bending structure 402-4 comprises a conductive line having a plurality of openings 414 therein. The bending structure 402-4 includes a width along the Y-direction and a length along the X-direction. As shown in detail 416, each opening 414 includes a first curved portion 418 and a second curved portion 420. The first curved portion 418 includes a curvature radius R1, and the second curved portion 420 includes a radius R2. The bending structure 402-4 can include any number of the openings 414 in various arrangements. In the example of FIG. 4D, the bending structure 402-4 includes one row of openings 414, but the bending structure 402-4 can include more than one row of openings 414. In the present example of FIG. 4D, each opening 414 is the same or similar in size, but in other examples the openings 414 can have different sizes from one opening to another.

There are numerous other types of bending structures that can be formed having different opening shapes and arrangements than shown in the examples of FIGS. 4A-4D. In general, each bending structure includes a plurality of openings, where a shape of at least one of the plurality of openings has a first curved portion. Each opening can have additional curved portions that have curvatures that are the same or similar to the curvature of the first curved portion. In an embodiment, the at least one opening further includes a second curved portion. In an embodiment, the curvature of the first curved portion is different than a curvature of the second curved portion. Each opening can have additional curved portions that have curvatures that are the same or similar to either the first or second curved portion. In an embodiment, each opening in a bending structure has an area between 5 µm² and 500 µm². In an embodiment, the bending structure can include at least one undulating edge.

The openings in the bending structure of a conductive line reduce the stress when the flexible substrate is bent or otherwise flexed. Further, the curved shape of each opening reduces the probability of a crack in the conductive line when the flexible substrate is bent or otherwise flexed. This is opposed to cases where the conductive line includes no openings or includes openings that have right-angles, where the probability of cracking is higher.

Figure 5:
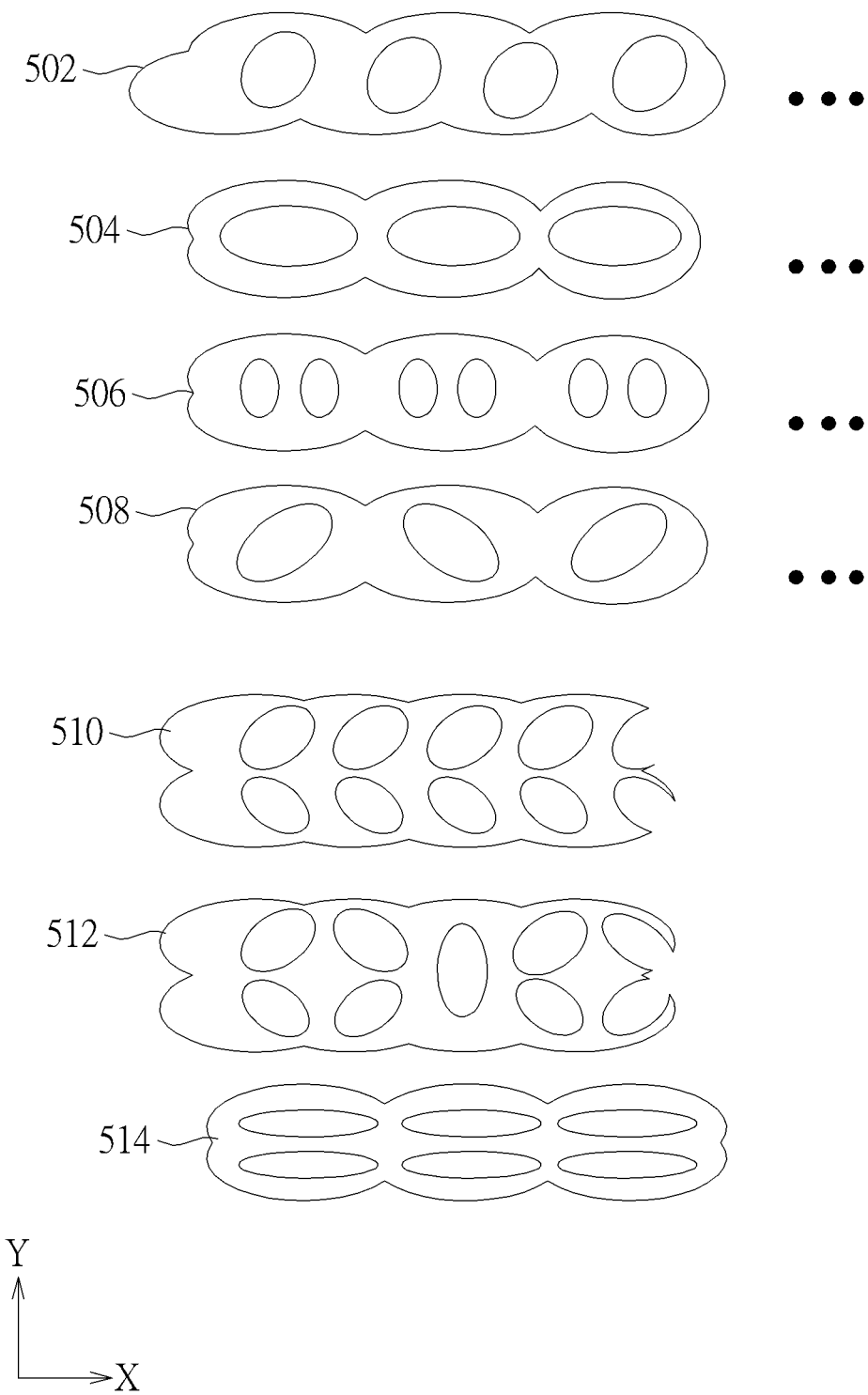
FIG. 5 shows top views of various arrangements of openings in bending structures according to embodiments.

FIG. 5 shows top views of various arrangements of openings in bending structures according to embodiments. The bending structures shown in FIG. 5 each include a plurality of elliptical openings similar to those shown in FIGS. 4B and 4C, but disposed in different patterns. A bending structure 502 includes a single row of elliptical openings, where the openings are rotated by some angle. The bending structure 504 includes a single row of elliptical openings. The bending structure 506 includes a single row of openings that are rotated 90 degrees with respect to the openings in FIGS. 4B and 4C. The bending structure 508 includes a single row of elliptical openings, where each opening has an angle of rotation that alternates between two different angles. The bending structure 510 includes two rows of elliptical openings, where the openings in the first row are rotated by a first angle and the openings in the second row are rotated by a second angle different than the first angle. The bending structure 512 includes a repeating pattern of four openings rotated by four different angles and one opening rotated 90 degrees with respect to the openings in FIGS. 4B and 4C. The bending structure 514 includes two rows of elliptical openings that are aligned instead of staggered. Each of the bending structures 502 . . . 514 includes undulating edges along the lengths thereof. In other embodiments, the bending structures 502 . . . 514 can include straight edges along the length thereof.

Figure 6A:
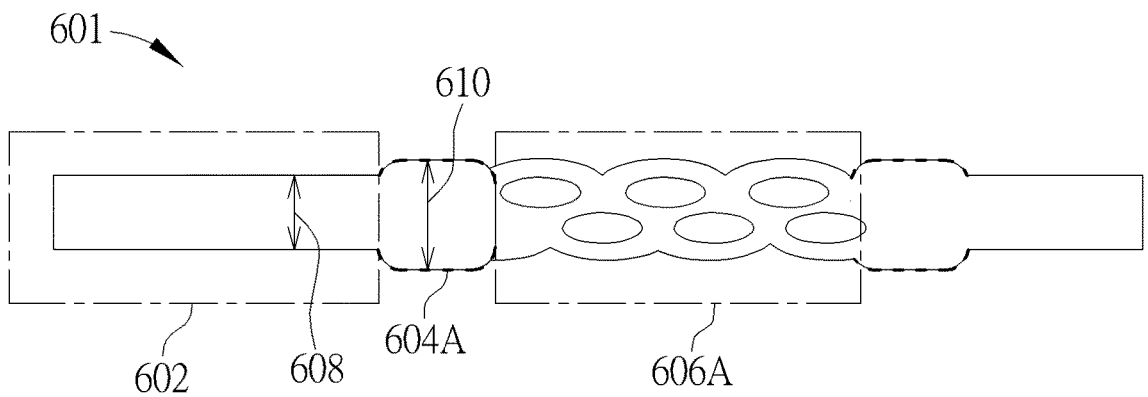
FIGS. 6A-6C are top views showing connecting portions of conductive lines according to embodiments.
Figure 6B:
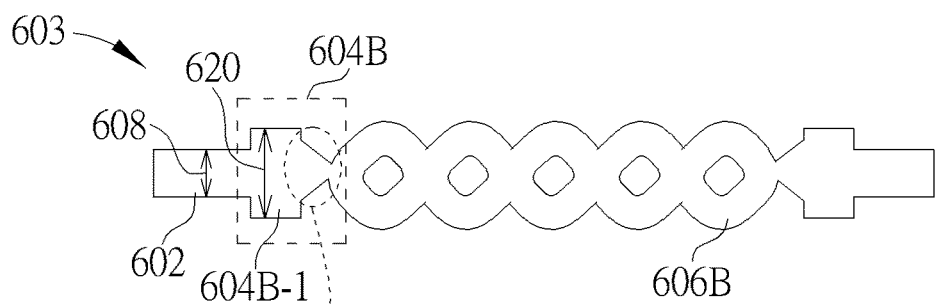
Figure 6B:
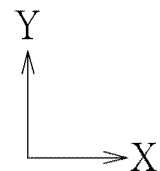
Figure 6C:
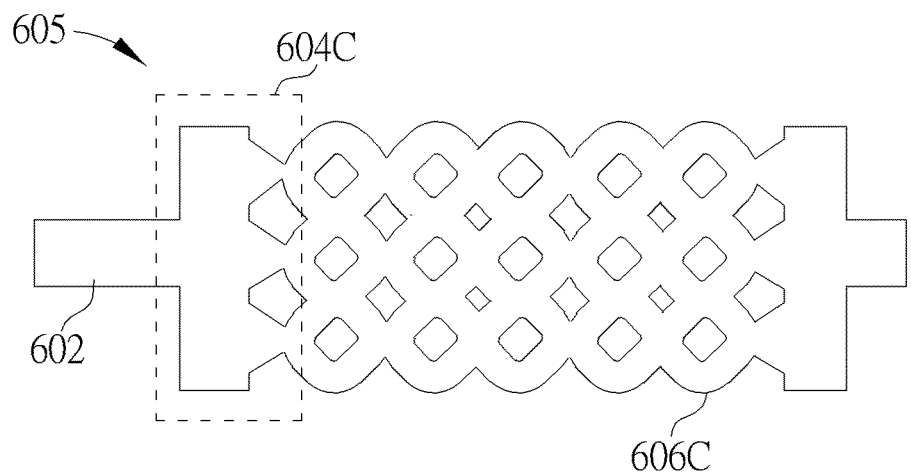

FIGS. 6A-6C are top views showing connecting portions of conductive lines according to embodiments. FIG. 6A shows a portion of a conductive line 601 (e.g., gate line, source line, or any other conductive line disposed on a substrate). The conductive line 601 includes a wiring portion 602 and a bending structure 606A. The wiring portion 602 has a width 608 along the Y-direction and a length along the X-direction. The wiring portion 602 does not include openings or other features of the bending structure 606. The wiring portion 602 can be, for example, a rectangular trace. The bending structure 606A includes a plurality of openings and undulating edges according to example bending structures described above. While a specific bending structure is shown in FIG. 6A, the bending structure 606A can have any of the structures discussed above. The wiring portion 602 is connected to the bending structure 606A by a connecting portion 604A. In the embodiment, the connecting portion 604A is generally rectangular and includes a width 610 along the Y-direction and a length along the X-direction. The width 610 is greater than the width 608 of the wiring portion 602. The bending structure 606A includes a width along the Y-direction and a length along the X-direction. The width of the bending structure 606A can be as wide as the width 610 of the connecting portion 604A or can be less than the width 610.

FIG. 6B shows a portion of a conductive line 603 (e.g., gate line, source line, or any other conductive line disposed on a flexible substrate). The conductive line 603 includes the wiring portion 602 connected to a bending structure 606B by a connecting portion 604B. While a specific bending structure is shown in FIG. 6B, the bending structure 606B can have any of the structures discussed above. As shown in detail 611, the connecting portion 604B includes a sub-portion 604B-1 and a sub-portion 604B-2. The sub-portion 604B-1 is generally rectangular, similar to the connecting portion 604A in FIG. 6A. The width 620 of the sub-portion 604B-1 along the Y-direction is greater than the width 608 of the wiring portion 602. The sub-portion 604B-2 is generally trapezoidal in shape having a first width 614 and a second width 616 along the Y-direction. The sub-portion 604B-1 is connected to the sub-portion 604B-2 at the side of the sub-portion 604B-2 having the width 614. The sub-portion 604B-2 is connected to the bending structure 606B at the side having the width 616. The first width 614 can be greater than the second width 616.

FIG. 6C shows a portion of a conductive line 605 (e.g., gate line, source line, or any other conductive line disposed on a flexible substrate). The conductive line 605 includes the wiring portion 602 connected to a bending structure 606C by a connecting portion 604C. While a specific bending structure is shown in FIG. 6C, the bending structure 606C can have any of the structures discussed above. In FIG. 6C, the connecting portion 604C is similar to the connecting portion 604B, but includes a plurality of the trapezoidal sub-portions connected to the bending structure 606C. While three of the trapezoidal sub-portions are shown, the bending structure 606C can include a plurality of trapezoidal sub-portions.

Figure 7A:
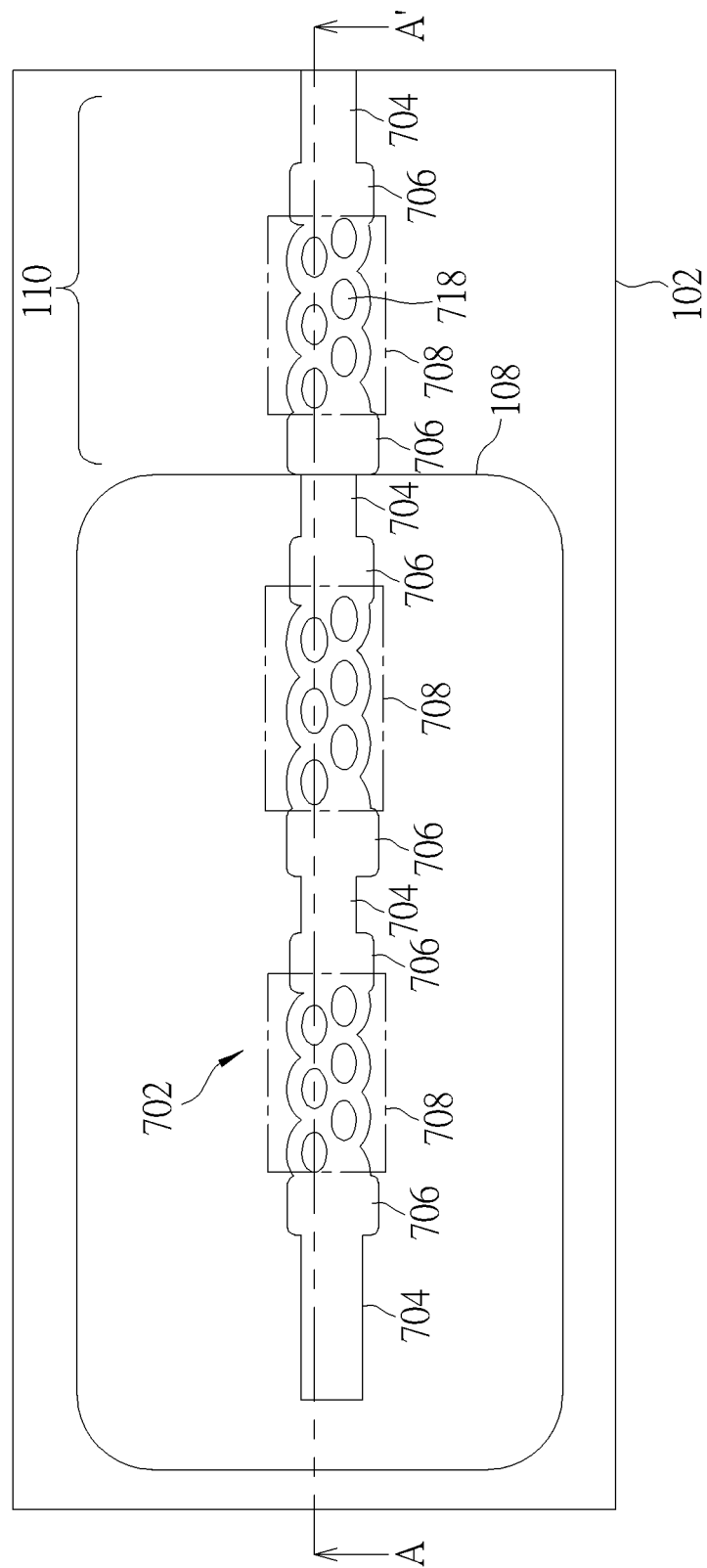
FIGS. 7A-7B are schematic top views showing placements of conductive lines on display devices according to embodiments.
Figure 7B:
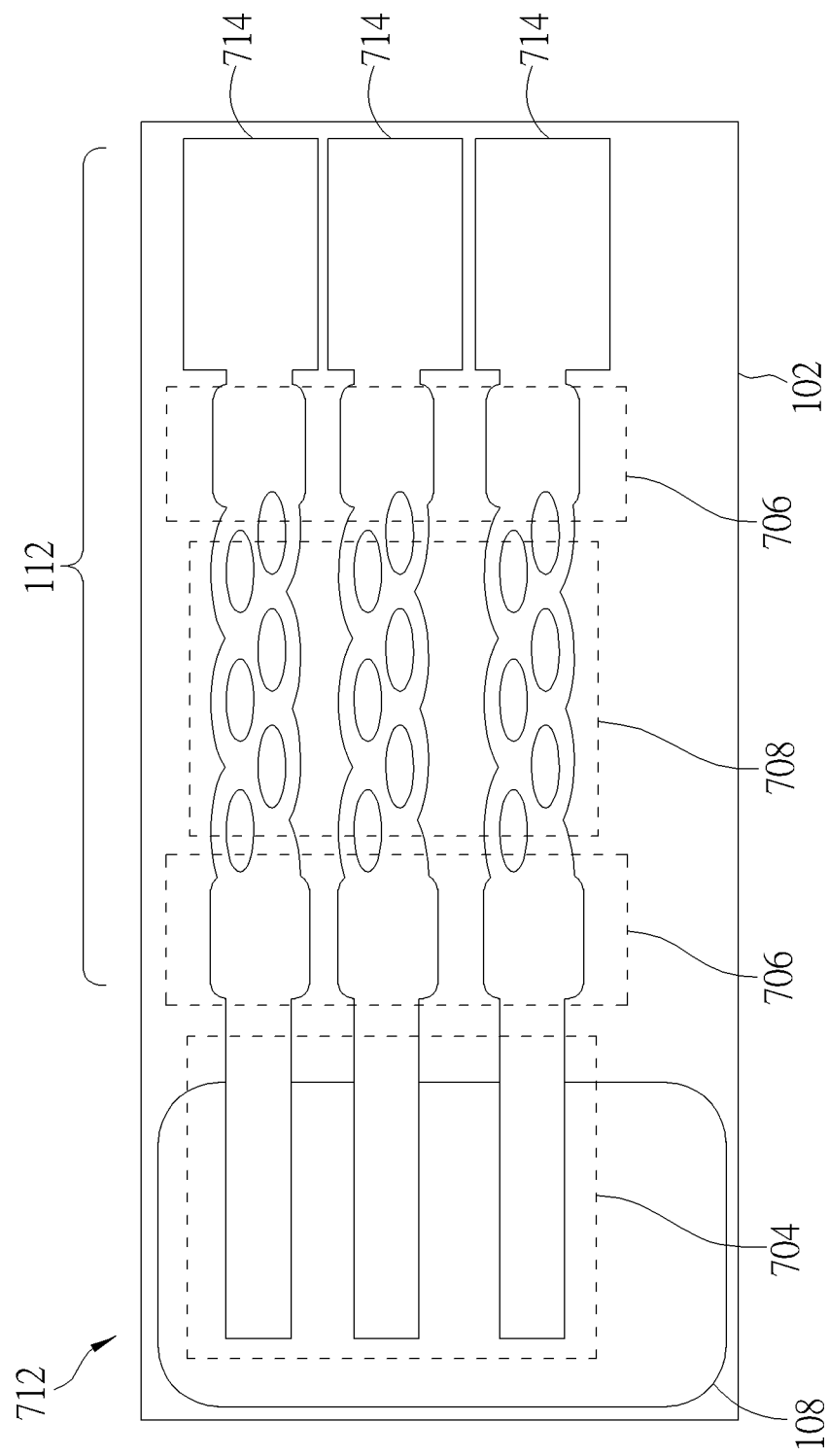

FIGS. 7A-7B are schematic top views showing placements of conductive lines on display devices according to embodiments. FIG. 7A is a schematic top view showing a conductive line 702 according to an embodiment. The conductive line 702 is disposed on the substrate 102 within both the active area region 108 and the inactive area region 110. The conductive line 702 includes wiring portions 704, connecting portions 706, and bending structures 708. Similar to the embodiments of FIGS. 6A-6C, the wiring portions 704 are connected to the bending structures 708 by the connecting portions 706. While specific connecting portions and bending structures are shown in FIG. 7A, the connecting portions 706 and bending structures 708 can have any structure described in the various embodiments herein. The bending structure 708 includes a plurality of openings 718. While the schematic shows the conductive line 702 as having three bending structures 708, the conductive line 702 generally includes at least one bending structure 708. The conductive line 702 can be a source line, gate line, or any other conductive line disposed on the substrate 102 discussed herein. While only a single conductive line 702 is shown in the schematic, the substrate 102 can include a plurality of the same or similar conductive lines. While the conductive line 702 includes bending structures 708 in both the active area region 108 and the inactive area region 110, the conductive line 702 can include bending structures 708 in only the active area region 108 or only the inactive area region 110.

FIG. 7B is a schematic top view showing a plurality of conductive lines 712 according to an embodiment. The conductive lines 712 (e.g., three are shown) are disposed on the substrate 102 within both the active area region 108 and the fan-out region 112. The conductive lines 712 include the wiring portions 704, the connecting portions 706, and the bending structures 708. Similar to the embodiments of FIGS. 6A-6C, the wiring portions 704 are connected to the bending portions 708 by the connecting portions 706. While specific connecting portions and bending structures are shown in FIG. 7B, the connecting portions 706 and bending structures 708 can have any structure described in the various embodiments herein. The conductive lines 712 include bending structures 708 disposed in the fan-out region 112. The conductive lines 712 are coupled to pads 714, which are in turn coupled to pins of the IC 106. Only a portion of the conductive lines 712 in the active area region 108 are shown. Similar to the embodiment of FIG. 7A, the conductive lines 712 can include bending structures 708 in the active area region 108.

Figure 8A:
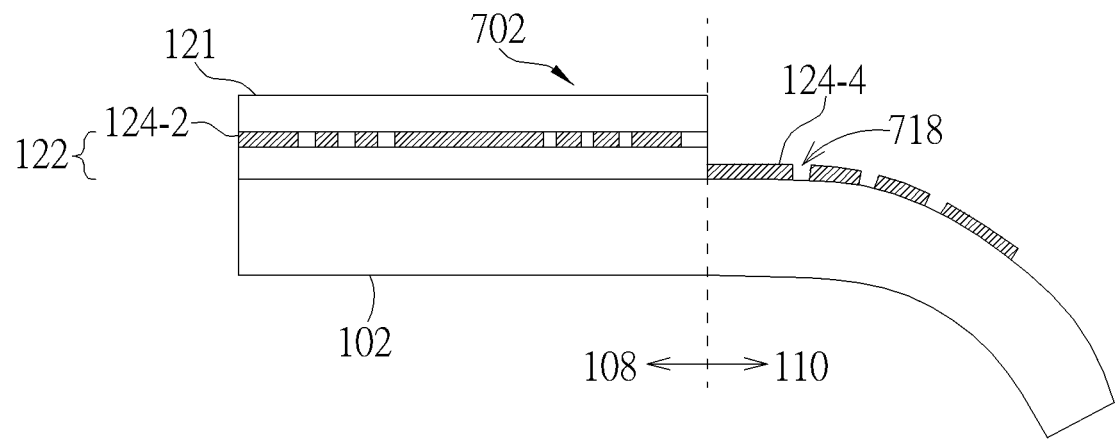
FIGS. 8A-8B are cross-sectional views of display device portions having conductive layers with bending structures according to embodiments.
Figure 8B:
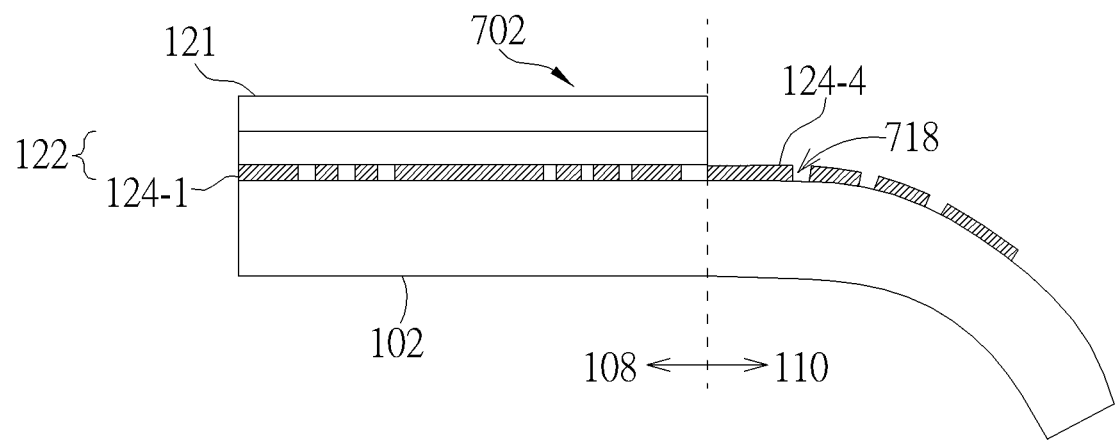

FIGS. 8A-8B are cross-sectional views of display device portions having conductive layers with bending structures according to embodiments. FIG. 8A is a cross-sectional view of a portion of the display device 100 taken along the line A-A' in FIG. 7A according to an embodiment. As shown, the conductive line 702 includes a portion that is patterned on the conductive layer 124-2 of the TFT layer 122. For example, the conductive line 702 can include a source line 116 coupled to source contacts of TFTs. The conductive line 702 also includes a portion that is patterned on the conductive layer 124-4 disposed in the inactive area region 110 on the substrate 102. The conductive layer 124-2 and the conductive layer 124-4 can be electrically connected (not shown) to form the conductive line 702. In the example, the substrate 102 is shown as being curved in the inactive area region 110 having the portion of the conductive line 702 on the conductive layer 124-4. In other examples, the substrate 102 can be curved, bent, stretched, or the like in other ways. In an embodiment, both portions of the conductive line 702 are made of the same material as the source and drain contacts in the TFT layer 122. In some embodiments, the conductive layer 124-2 forming the source and drain contacts in the active area region 108 and the conductive layer 124-4 including the bending structure in the inactive active region 110 can be of the same material, and specifically, can be the same layer and formed by the same process.

In some embodiments, referring to FIG. 8A, the TFT layer 122 can include a TFT as shown in FIG. 3 (not shown in FIG. 8A), and the TFT includes a source contact 314 and a drain contact 312. A material of the conductive line including the bending structure, and a material of at least one of the source contact and the drain contact, are the same. For example, a conductive layer can be formed on the substrate 102, and then the conductive layer can be patterned by photolithography in the same process to form the source line, the source contact, the drain contact, and the conductive line including the bending structure. The conductive line including the bending structure can be disposed in the inactive area region 110, in the active area region 108, or both in the inactive area region 110 and the active area region 108.

FIG. 8B is a cross-sectional view of a portion of the display device 100 taken along the line A-A' in FIG. 7A according to another embodiment. As shown, the conductive line 702 includes a portion that is patterned on the conductive layer 124-1 of the TFT layer 122. For example, the conductive line 702 can be a gate line 114 coupled to gate electrodes of TFTs. The conductive line 702 also includes a portion that is patterned on the conductive layer 124-4 disposed in the inactive area region 110 on the substrate 102. The conductive layer 124-1 and the conductive layer 124-4 can be electrically connected (not shown) to form the conductive line 702. In the example, the substrate 102 is shown as being curved in the inactive area region 110 having the portion of the conductive line 702 on the conductive layer 124-4. In other examples, the substrate 102 can be curved, bent, stretched, or the like in other ways. In an embodiment, both portions of the conductive line 702 are made of the same material as the gate electrodes in the TFT layer 122. In some embodiments, the conductive layer 124-1 forming the gate electrode in the active area region 108 and the conductive layer 124-4 including the bending structure in the inactive active region 110 can be of the same material, and specifically, can be the same layer and formed by the same process.

In some embodiments, referring to FIG. 8B, the TFT layer 122 can include a TFT as shown in FIG. 3 (not shown in FIG. 8B), and the TFT includes a gate electrode 316. A material of the conductive line including the bending structure, and a material of the gate electrode are the same. For example, a conductive layer can be formed on the substrate 102, and then the conductive layer can be patterned by photolithography in the same process to form the gate line, the gate electrode, and the conductive line including the bending structure. The conductive line including the bending structure can be disposed in the inactive area region 110, in the active area region 108, or both in the inactive area region 110 and the active area region 108.

Figure 9A:
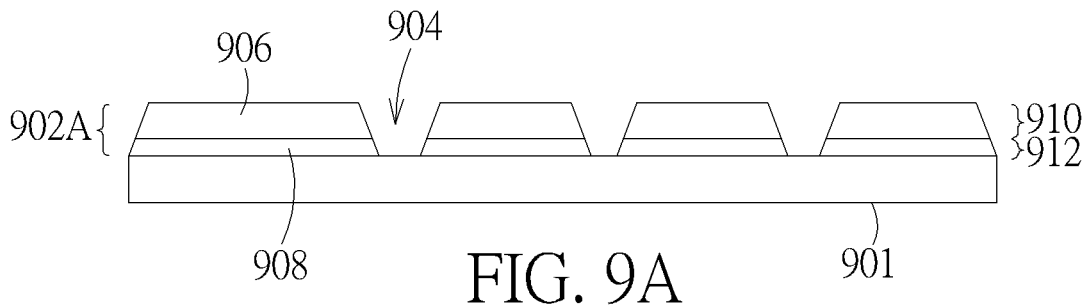
FIGS. 9A-9D are cross-sectional views of conductive lines having multilayer structures according to embodiments.

FIGS. 9A-9D are cross-sectional views of conductive lines having multilayer structures according to embodiments. FIG. 9A is a cross-sectional view of a conductive line 902A disposed on a layer 901 according to an embodiment. The layer 901 can be the substrate or some other layer (e.g., a layer in the TFT layer 122). The conductive line 902A includes openings 904 in bending structures thereof, as discussed in the various embodiments above. In the present embodiment, the conductive line 902A includes two layers 906 and 908. The layer 908 is disposed on the layer 901, and the layer 906 is disposed on the layer 908. The layer 906 has a thickness 910, and the layer 908 has a thickness 912. In an embodiment, the thickness 910 of the layer 906 is greater than the thickness 912 of the layer 908. In an embodiment, the conductive material of the layer 906 is different than the conductive material of the layer 908. The layer 908 can be a conductive material that provides increased adhesion to the layer 901, whereas the layer 906 can be a material that provides for increased toughness.

Figure 9B:
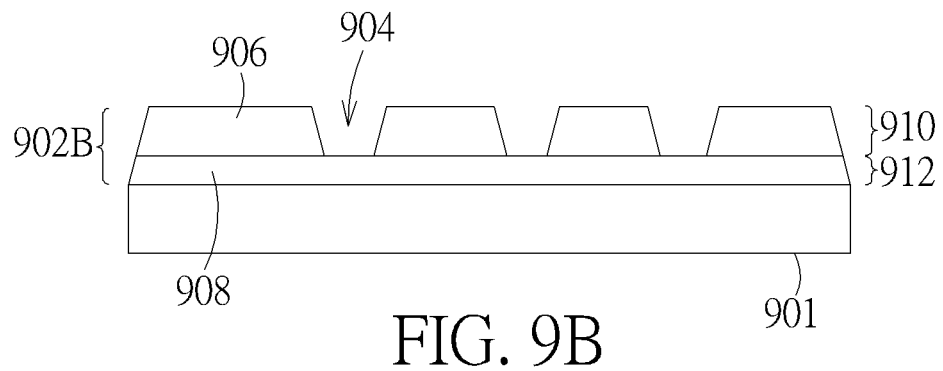

FIG. 9B is a cross-sectional view of a conductive line 902B disposed on a layer 901 according to an embodiment. The conductive line 902B is configured similar to the conductive line 902A, with the exception of the layer 908. In the embodiment of FIG. 9A, the openings 904 of the bending structures are in both of the layers 906 and 908. In the embodiment of FIG. 9B, the openings 904 are only in the layer 906. The layer 908 does not include openings.

Figure 9C:
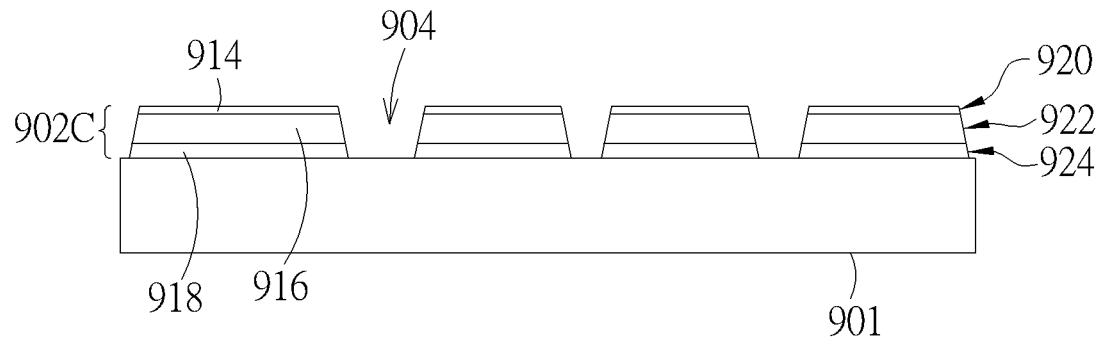

FIG. 9C is a cross-sectional view of a conductive line 902C disposed on a layer 901 according to an embodiment. In the embodiment of FIG. 9C, the conductive line 902C includes three layers 914, 916, and 918. The layer 918 is disposed on the layer 901; the layer 916 is disposed on the layer 918; and the layer 914 is disposed on the layer 916. The openings 914 are through all layers 914 ... 918. The thicknesses 920, 922, and 924 of the layers 914, 916, and 918 can be different. For example, the thickness 922 of the layer 916 can be greater than the thicknesses 920 and 924 of the layers 914 and 918, respectively. The thickness 920 of the layer 914 can be more, less, or the same as the thickness 924 of the layer 918. In an embodiment, the conductive material of the layer 916 is different than the conductive material of the layers 914 and 918. The layer 918 can be a conductive material that provides increased adhesion to the layer 901, whereas the layer 916 can be a material that provides for increased toughness. In some embodiments, the layer 914 and the layer 918 can be of the same material, and the layer 916 can be a different material from the layer 914. For example, the layer 914 and 918 can be Mo, and the layer 916 can be Al.

Figure 9D:
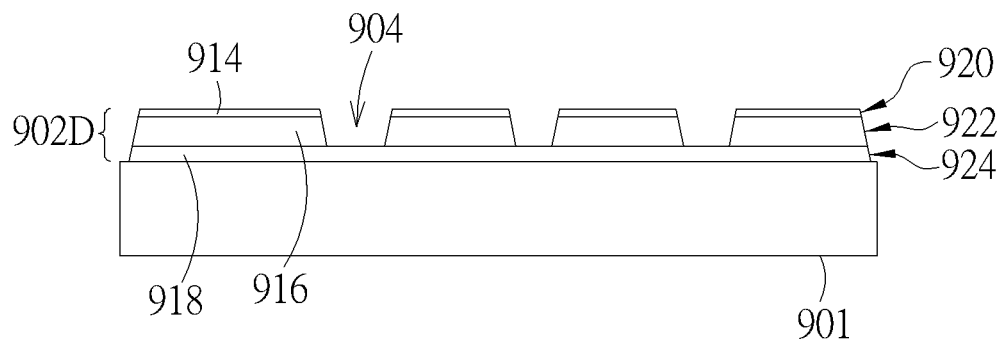

FIG. 9D is a cross-sectional view of a conductive line 902D disposed on a layer 901 according to an embodiment. In the embodiment of FIG. 9D, the conductive line 902D includes three layers 914, 916, and 918, similar to the conductive line 902C in FIG. 9C. However, in the embodiment of FIG. 9D, the layer 918 does not include the openings 904. That is, the openings 904 are only through the layers 914 and 916.

Figure 10A:
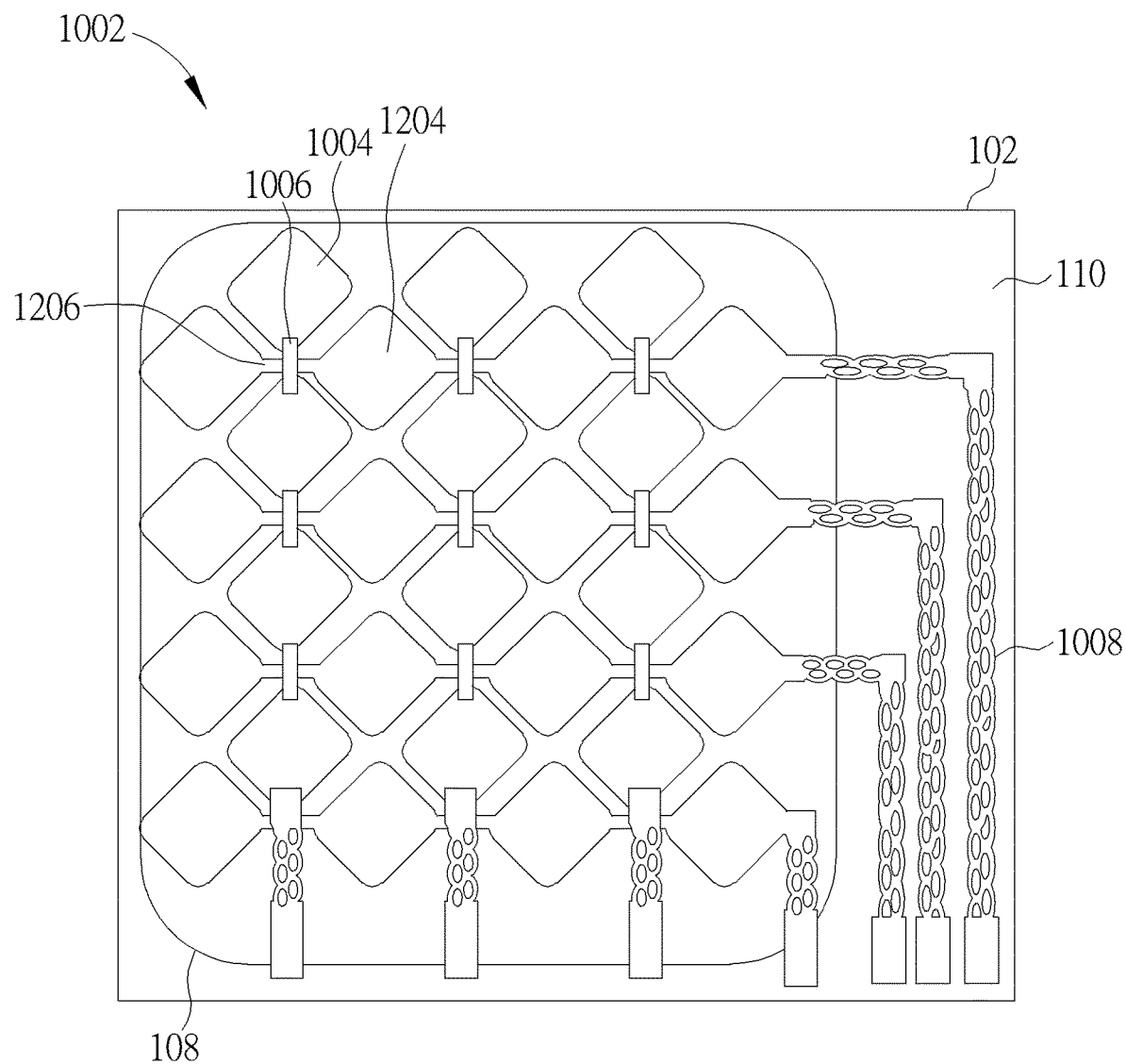
FIGS. 10A-B are top views showing touch electrode layers having bending structures according to embodiments.
Figure 10B:
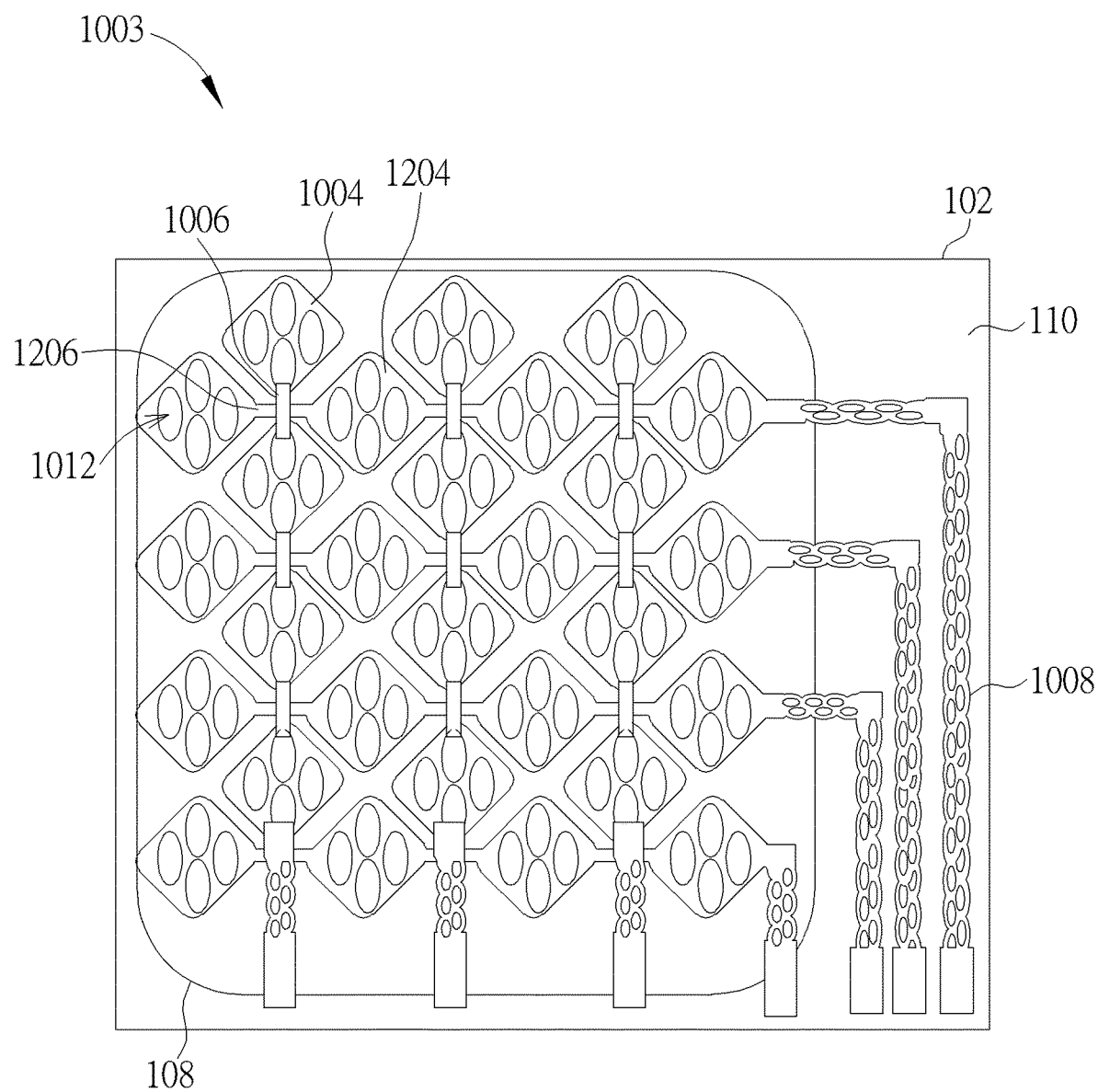

FIGS. 10A-B are schematic top views showing touch electrode layers having bending structures according to embodiments. FIG. 10A is a schematic top view showing a touch electrode layer 1002 according to an embodiment. The touch electrode layer 1002 is disposed on the substrate 102 in the active area region 108 (e.g., on a layer above the light-emitting layer 121 or between the TFT layer 122 and the light-emitting layer 121). The touch electrode layer 1002 can include a plurality columns of electrodes 1004 and a plurality rows of electrodes 1204. For one column of touch electrodes, two adjacent touch electrodes 1004 are electrically connected by the connecting structure 1006. For one row of touch electrodes, two adjacent touch electrodes 1204 are electrically connected by the connecting structure 1206. The touch electrode layer 1002 further includes a plurality of conductive lines 1008 disposed on the substrate 102 in both the active area region 108 and the inactive area region 110. The conductive lines 1008 can be coupled to pins of the IC 106. Some of the conductive lines 1008 are coupled to columns of the touch electrodes 1004, and others of the conductive lines 1008 are coupled to rows of the touch electrodes 1204. The columns of the touch electrodes 1004 are ohmically isolated (or electrically insulated) from each other and from the rows of the touch electrodes 1204. The conductive lines 1008 include bending structures that can be in the active area region 108, the inactive area region 110, or both.

FIG. 10B is a schematic top view showing a touch electrode layer 1003 according to an embodiment. The touch electrode layer 1003 is configured similarly to the touch electrode layer 1002 shown in FIG. 10A. In the embodiment of FIG. 10A, the touch electrodes 1004 and 1204 do not include openings therein. In the embodiment of FIG. 10B, each of the touch electrodes 1004 includes one or more openings 1012, and each of the touch electrodes 1204 includes one or more openings 1012. In some embodiments, at least one of the touch electrodes in the active area region 108 includes the bending structure. In the example shown, each touch electrode 1004 (or touch electrodes 1204) includes four elliptical openings. In general, one or more of the touch electrodes 1004 (or touch electrodes 1204) can include one or more openings, and the openings can have various shapes and arrangements, similar to the openings in the bending structures described above for the conductive lines.

In the various embodiments described above, conductive lines and/or touch electrodes are described as having bending structures to reduce strain when a flexible substrate is flexed in some manner. The embodiments are described with respect to a flexible substrate of a display device. However, the embodiments are applicable to flexible substrates in general and can be used in other types of devices having flexible substrates and circuitry requiring conductive lines and/or electrodes.

While the foregoing is directed to specific examples, other and further examples may be devised without departing from the basic scope thereof, and the scope thereof is determined by the claims that follow.

What is claimed is:

1. A display device, comprising:
    a substrate including a surface;
    a thin film transistor disposed on the surface;
    a light emitting diode element disposed on the surface and electrically connected to the thin film transistor; and
    a conductive layer disposed on the surface, the conductive layer including a bending structure, the bending structure comprising an undulating edge and including a plurality of openings where a shape of at least one opening of the plurality of openings has a contour having a first curved portion,
    wherein a curvature of a portion of the undulating edge is different from a curvature of the first curved portion.

2. The display device of claim 1, wherein the at least one opening has an area between 5 $\mu m^2$ and 500 $\mu m^2$.

3. The display device of claim 1, wherein the at least one opening further includes a second curved portion, where a curvature of the first curved portion is different than a curvature of the second curved portion.

4. The display device of claim 1, wherein the conductive layer further includes:
    a conductive line extending along a first direction, the conductive line including a wiring portion, a connecting portion, and the bending structure, the connecting portion disposed between the bending structure and the wiring portion, the connecting portion having a first width along a second direction substantially perpendicular to the first direction, the wiring portion having a second width along the second direction, and the first width being greater than the second width.

5. The display device of claim 4, wherein the thin film transistor includes a source contact and a drain contact, where a material of the conductive line, and a material of at least one of the source contact and the drain contact are the same.

6. The display device of claim 4, wherein the thin film transistor includes a gate electrode, where a material of the conductive line and a material of the gate electrode are the same.

7. The display device of claim 1, wherein the conductive layer includes a first layer and a second layer disposed on the first layer, a material of the first layer being different than a material of the second layer.

8. The display device of claim 1, wherein the conductive layer includes a first layer and a second layer disposed on the first layer, a thickness of the first layer is different than a thickness of the second layer.

9. The display device of claim 1, wherein the conductive layer includes a touch signal line, the touch signal line including the bending structure.

10. The display device of claim 1, wherein the conductive layer includes a touch electrode, the touch electrode including the bending structure.

11. A substrate, comprising:
a surface;
a plurality of thin film transistors disposed on the surface; and
a conductive layer disposed on the surface, the conductive layer including a bending structure, the bending structure comprising an undulating edge and including a plurality of openings, where a shape of at least one opening of the plurality of openings has a contour having a first curved portion,
wherein a curvature of a portion of the undulating edge is different from a curvature of the first curved portion.

12. The substrate of claim 11, wherein the at least one opening has an area between 5 $\mu m^2$ and 500 $\mu m^2$.

13. The substrate of claim 11, wherein the at least one opening further includes a second curved portion, where a curvature of the first curved portion is different than a curvature of the second curved portion.

14. The substrate of claim 11, wherein the conductive layer further includes:
a conductive line extending along a first direction, the conductive line including a wiring portion, a connecting portion, and the bending structure, the connecting portion disposed between the bending structure and the wiring portion, the connecting portion having a first width along a second direction substantially perpendicular to the first direction, the wiring portion having a second width along the second direction, and the first width being greater than the second width.

15. The substrate of claim 14, wherein the plurality of thin film transistors includes a first patterned metal layer, where a material of the conductive line and a material of the first patterned metal layer are the same.

16. The substrate of claim 11, wherein the conductive layer includes a first layer and a second layer disposed on the first layer, a material of the first layer being different than a material of the second layer.

17. The substrate of claim 11, wherein the conductive layer includes a first layer and a second layer disposed on the first layer, a thickness of the first layer is different than a thickness of the second layer.

18. The substrate of claim 11, wherein the conductive layer includes an electrode, the electrode including the bending structure.

* * * * *